(12) United States Patent
Maszara et al.

(10) Patent No.: US 7,871,873 B2
(45) Date of Patent: Jan. 18, 2011

(54) METHOD OF FORMING FIN STRUCTURES USING A SACRIFICIAL ETCH STOP LAYER ON BULK SEMICONDUCTOR MATERIAL

(75) Inventors: Witold Maszara, Morgan Hill, CA (US); Ming-Ren Lin, Cupertino, CA (US); Jin Cho, Palo Alto, CA (US); Zoran Krivokapic, Santa Clara, CA (US)

(73) Assignee: GLOBAL FOUNDRIES Inc., Grand Cayman (KY)

( * ) Notice: Subject to any disclaimer, the term of this patent is extended or adjusted under 35 U.S.C. 154(b) by 130 days.

(21) Appl. No.: 12/413,174

(22) Filed: Mar. 27, 2009

(65) Prior Publication Data

US 2010/0248454 A1 Sep. 30, 2010

(51) Int. Cl.
*H01L 21/00* (2006.01)
*H01L 21/84* (2006.01)
*H01L 21/336* (2006.01)

(52) U.S. Cl. ............... 438/164; 438/294; 257/E21.159; 257/E21.41

(58) Field of Classification Search ................. 438/664, 438/268, 294, 682, 229, 164, 157, 159, 151; 257/E21.159, E21.41, E21.639, E21.54
See application file for complete search history.

(56) References Cited

U.S. PATENT DOCUMENTS

| | | | |
|---|---|---|---|
| 6,642,090 B1 | 11/2003 | Fried et al. | |
| 6,872,647 B1 | 3/2005 | Yu et al. | |
| 6,921,963 B2 | 7/2005 | Krivokapic et al. | |
| 7,495,285 B2 * | 2/2009 | Lee | 257/324 |
| 7,517,764 B2 * | 4/2009 | Booth et al. | 438/300 |
| 7,611,938 B2 * | 11/2009 | Cheng et al. | 438/199 |
| 2004/0150029 A1 * | 8/2004 | Lee | 257/308 |
| 2004/0266077 A1 * | 12/2004 | Yeo et al. | 438/157 |
| 2006/0091428 A1 * | 5/2006 | Yeo et al. | 257/213 |
| 2007/0075351 A1 * | 4/2007 | Schulz et al. | 257/314 |
| 2008/0050902 A1 * | 2/2008 | John et al. | 438/597 |
| 2008/0064149 A1 * | 3/2008 | Cohen | 438/157 |

(Continued)

OTHER PUBLICATIONS

Arney, S.C., et al. "Formation of submicron silicon-on-insulator structures by lateral oxidation of substrate-silicon islands," J.Vac.Sci. Technol. vol. B6, No. 1. Jan./Feb. 1988: pp. 341-345.

(Continued)

*Primary Examiner*—Walter L Lindsay, Jr.
(74) *Attorney, Agent, or Firm*—Ingrassia Fisher & Lorenz, P.C.

(57) ABSTRACT

A method of manufacturing semiconductor fins for a semiconductor device may begin by providing a bulk semiconductor substrate. The method continues by growing a layer of first epitaxial semiconductor material on the bulk semiconductor substrate, and by growing a layer of second epitaxial semiconductor material on the layer of first epitaxial semiconductor material. The method then creates a fin pattern mask on the layer of second epitaxial semiconductor material. The fin pattern mask has features corresponding to a plurality of fins. Next, the method anisotropically etches the layer of second epitaxial semiconductor material, using the fin pattern mask as an etch mask, and using the layer of first epitaxial semiconductor material as an etch stop layer. This etching step results in a plurality of fins formed from the layer of second epitaxial semiconductor material.

19 Claims, 6 Drawing Sheets

U.S. PATENT DOCUMENTS

| | | | |
|---|---|---|---|
| 2008/0265308 A1* | 10/2008 | Lee | 257/324 |
| 2008/0296702 A1* | 12/2008 | Lee et al. | 257/401 |
| 2009/0121288 A1* | 5/2009 | Patruno | 257/347 |
| 2009/0278196 A1* | 11/2009 | Chang et al. | 257/328 |
| 2010/0015768 A1* | 1/2010 | Jang et al. | 438/268 |
| 2010/0015802 A1* | 1/2010 | Snyder et al. | 438/664 |
| 2010/0075473 A1* | 3/2010 | Gibbons | 438/157 |
| 2010/0127327 A1* | 5/2010 | Chidambarrao | 257/347 |
| 2010/0144121 A1* | 6/2010 | Chang et al. | 438/478 |
| 2010/0163971 A1* | 7/2010 | Hung et al. | 257/327 |

OTHER PUBLICATIONS

Hisamoto, D., et al. "A Fully Depleted Lean-channel Transistor (DELTA)—A novel vertical ultra thing SOI MOSFET—". IEEE, 1989. pp. 833-836.

U.S. Appl. No. 12/099,726, filed Apr. 8, 2008.

U.S. Appl. No. 12/176,866, filed Jul. 21, 2008.

* cited by examiner

US 7,871,873 B2

METHOD OF FORMING FIN STRUCTURES USING A SACRIFICIAL ETCH STOP LAYER ON BULK SEMICONDUCTOR MATERIAL

TECHNICAL FIELD

Embodiments of the subject matter described herein relate generally to semiconductor devices and related manufacturing processes. More particularly, embodiments of the subject matter relate to methods of forming semiconductor devices, such as FinFET devices, from a bulk semiconductor substrate.

BACKGROUND

Transistors, such as metal oxide semiconductor field-effect transistors (MOSFETs), are the core building block of the vast majority of semiconductor devices. Some semiconductor devices, such as high performance processor devices, can include millions of transistors. For such devices, decreasing transistors size, and thus increasing transistor density, has traditionally been a high priority in the semiconductor manufacturing industry.

A FinFET is a type of transistor that can be fabricated using very small scale processes. FIG. 1 is a simplified perspective view of a FinFET 100, which is formed on a semiconductor wafer substrate 102. A FinFET is named for its use of one or more conductive fins (FinFET 100 includes only one fin 104). As shown in FIG. 1, fin 104 extends between a source region 106 and a drain region 108 of FinFET 100. FinFET 100 includes a gate structure 110 that is wrapped around fin 104. The dimensions of fin 104 as wrapped by gate structure 110 determine the effective channel of FinFET 100. Accordingly, the height of fin 104 is an important dimension—the height generally corresponds to the gate/channel length of a traditional transistor. FIG. 2 is a simplified perspective view of another FinFET 200; this particular version includes three fins 202 extending between a source region 204 and a drain region 206. As with FinFET 100, a gate structure 208 is formed across the three fins 202. When multiple fins are employed in this manner, it can be extremely important to maintain uniform fin dimensions, including fin height, thickness, and pitch (the distance between two adjacent fins, plus fin thickness).

FinFET devices have historically been formed using silicon-on-insulator (SOI) substrates. Using an SOI substrate, the conductive fins are formed from the silicon material, while the insulator layer provides isolation between adjacent FinFET devices. The insulator layer also serves to define the height of the fins during manufacturing. Bulk silicon substrates are less expensive than SOI substrates, and FinFET devices can also be fabricated using bulk silicon if appropriate isolation methodologies are utilized. However, such fabrication processes typically involve at least one polishing step (e.g., chemical mechanical polishing, which can represent another source of fin height variation, add to the manufacturing cost, and increase the manufacturing time.

BRIEF SUMMARY

A method of fabricating a fin structure for a semiconductor device can begin by providing a bulk substrate formed from a first semiconductor material. Thereafter, the method forms a layer of etch stop material overlying the bulk substrate, and forms a layer of second semiconductor material overlying the layer of etch stop material. The etch stop material is preferably resistant to etchants that etch the second semiconductor material. Next, the method creates a fin pattern mask on the layer of second semiconductor material, and thereafter anisotropically etches the layer of second semiconductor material, using the fin pattern mask as an etch mask. This results in a fin formed from the second semiconductor material, wherein the layer of etch stop material remains substantially intact following etching.

Also provided is a method of manufacturing a finned semiconductor device structure. This method begins by providing a substrate comprising bulk semiconductor material, an epitaxially grown layer of etch stop material on the bulk semiconductor material, an epitaxially grown layer of second semiconductor material on the etch stop material, and a layer of hard mask material overlying the second semiconductor material. The method continues by creating a fin pattern mask from the hard mask material, the fin pattern mask having features corresponding to at least one fin. Then, the method anisotropically etches the layer of second semiconductor material with an etchant, using the fin pattern mask as an etch mask—the etch stop material is preferably resistant to the etchant. This results in at least one fin formed from the second semiconductor material.

A method of manufacturing semiconductor fins for a semiconductor device is also provided. This method provide a bulk semiconductor substrate, grows a layer of first epitaxial semiconductor material on the bulk semiconductor substrate, and grows a layer of second epitaxial semiconductor material on the layer of first epitaxial semiconductor material. The method continues by creating a fin pattern mask on the layer of second epitaxial semiconductor material, the fin pattern mask having features corresponding to a plurality of fins. The method proceeds by anisotropically etching the layer of second epitaxial semiconductor material, using the fin pattern mask as an etch mask, and using the layer of first epitaxial semiconductor material as an etch stop layer. The etching results in a plurality of fins formed from the layer of second epitaxial semiconductor material.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor transistor devices are well known and so, in the interest of brevity, many conventional steps will only be mentioned briefly herein or will be omitted entirely without providing the well known process details.

A variety of FinFET devices and related fabrication processes are known. For example, U.S. Pat. Nos. 6,872,647 and 6,921,963—both assigned to Advanced Micro Devices, Inc.—are related to FinFETs and processes for manufacturing FinFETs (the relevant content of these two patents is incorporated by reference herein). In accordance with the traditional manufacturing techniques described in these two patents, conductive fins in a FinFET device are formed using photolithography, etching, and other conventional process steps. FinFET performance is dependent on the height, thickness, and pitch of fins, and these dimensions should be uniform and closely controlled during manufacturing. In this regard, fabricating FinFETs using modern semiconductor manufacturing processes (e.g., 22 nm and smaller technologies) can be challenging due to the importance of controlling the dimensions of the fins. The fabrication techniques described herein can be utilized to precisely control the fin dimensions—in particular, the fin height—of fin structures formed from a bulk semiconductor substrate.

The techniques and technologies described herein can be utilized to form fin structures for finned semiconductor devices, using a bulk semiconductor substrate rather than an SOI substrate. In this regard, FIGS. 3-13 are cross sectional views that illustrate an embodiment of a finned semiconductor device structure and a related fabrication method. This fabrication process represents one implementation of a method that is suitable for use with finned semiconductor devices, such as FinFETs. In practice, however, the fabrication process could be used to form semiconductor fins that are ultimately used for other semiconductor devices.

Figure 3:
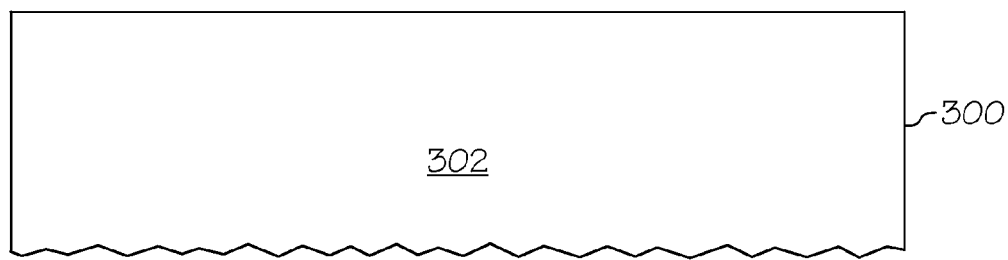
FIGS. 3-13 are cross sectional views that illustrate an embodiment of a finned semiconductor device structure and a related fabrication method.

An embodiment of the fabrication process may begin by providing an appropriate bulk substrate that is formed from or otherwise comprises a semiconductor material. FIG. 3 depicts a portion of a bulk substrate 300, which is preferably formed from a semiconductor material 302. The semiconductor material 302 is preferably a silicon material as typically used in the semiconductor industry, e.g., relatively pure silicon as well as silicon admixed with other elements such as germanium, carbon, and the like. Alternatively, semiconductor material 302 can be germanium, gallium arsenide, or the like. Semiconductor material 302 need not be doped, although it may be very lightly doped as either N-type or P-type, without impacting the manufacturing process described here. For example, bulk silicon substrates are often provided as lightly doped P-type substrates, and a lightly doped P-type semiconductor material 302 could be used for the embodiment described here. Of course, semiconductor material 302 can be subsequently doped in an appropriate manner to form active regions in a manner that is well understood by those familiar with semiconductor manufacturing techniques.

Figure 4:
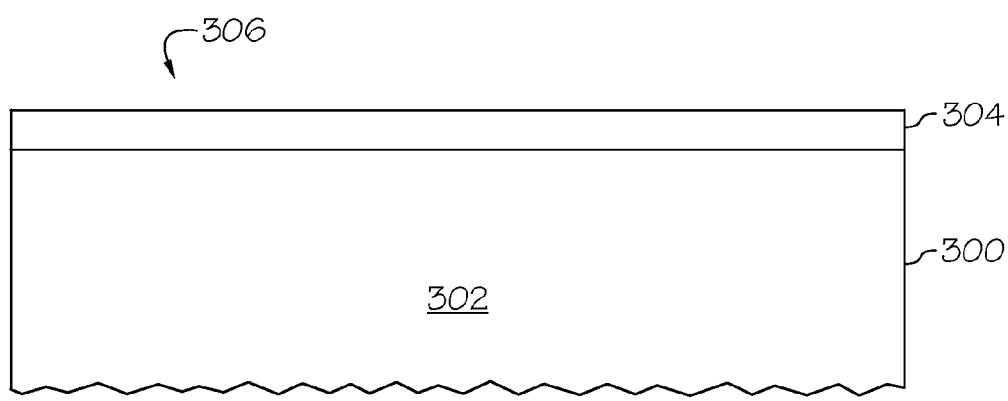

The process may continue by forming an etch stop layer 304 overlying bulk substrate 300 (and, therefore, overlying semiconductor material 302). FIG. 4 depicts the semiconductor device structure 306 after formation of etch stop layer 304. Etch stop layer 304 is formed from an appropriate etch stop material, which is preferably resistant, impermeable, or immune to etchants that are used in one or more subsequent etching steps (described below). In preferred embodiments, etch stop layer 304 is formed by epitaxially growing a layer of a different type of semiconductor material on the semiconductor material 302. Accordingly, etch stop layer 304 may also be referred to herein as a layer of epitaxial semiconductor material. For reasons explained below, the semiconductor material used for etch stop layer 304 has properties and characteristics that allow it to be oxidized.

In preferred embodiments, bulk substrate 300 is a bulk silicon substrate (thus, semiconductor material 302 comprises silicon). In such preferred embodiments, etch stop layer 304 is formed by selectively epitaxially growing a silicon material (such as silicon germanium) on the bulk silicon material. Epitaxial silicon germanium can be grown in accordance with known process techniques. In this regard, epitaxial silicon germanium can be selectively grown on the exposed silicon surfaces under proper conditions. In practice, etch stop layer 304 has a thickness in the range of about 10 to 30 nm, although thicknesses outside of this typical range could be utilized. Notably, to enhance its etch stopping characteristics, etch stop layer 304 is preferably formed from silicon germanium having significant germanium content (e.g., greater than one percent). Silicon germanium is suitable for use in practical embodiments because it can be oxidized, it can serve as an effective etch stop, and additional semiconductor material can be epitaxially grown on its surface. It should be noted that other materials having the same general properties and characteristics could be used in lieu of silicon germanium. That said, silicon germanium is commonly used for other purposes in semiconductor manufacturing processes, is accepted for use in the industry, and is well documented. Accordingly, preferred embodiments employ silicon germanium for etch stop layer 304.

Figure 5:
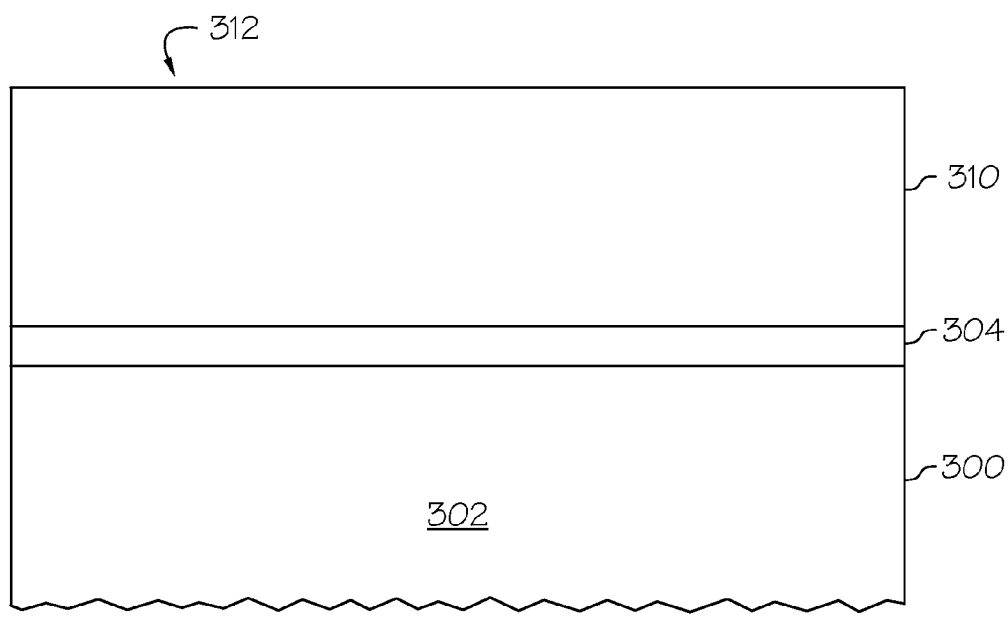

The process may continue by forming another layer of semiconductor material 310 overlying etch stop layer 304. FIG. 5 depicts the semiconductor device structure 312 after formation of the layer of semiconductor material 310. The semiconductor material 310 will be anisotropically etched with a suitable etchant in a subsequent process step (described below). Notably, the etchant used to anisotropically etch the semiconductor material 310 does not significantly etch the material used for etch stop layer 304. In other words, etch stop layer 304 is resistant to etchants that can etch the semiconductor material 310. In preferred embodiments, the semiconductor material 310 and the bulk substrate 300 comprise the same material, e.g., silicon. However, the use of the same semiconductor material is not always required, and alternate embodiments could utilize different materials for bulk substrate 300 and the upper layer of semiconductor material 310.

In preferred embodiments, the layer of semiconductor material 310 is formed by epitaxially growing it on etch stop layer 304. Accordingly, semiconductor material 310 may also be referred to herein as a layer of epitaxial semiconductor material. As mentioned previously, semiconductor material 302 preferably comprises silicon, and etch stop layer 304 preferably comprises silicon germanium. In such preferred embodiments, the layer of semiconductor material 310 is formed by selectively epitaxially growing silicon on the silicon germanium that forms etch stop layer 304. Epitaxial silicon can be grown on silicon germanium in accordance with known process techniques, as described briefly above. In practice, semiconductor material 310 has a thickness in the range of about 20 to 50 nm, although thicknesses outside of this typical range could be utilized. Notably, semiconductor material 310 will ultimately be used to form conductive fin structures. Therefore, semiconductor material 310 preferably comprises device quality silicon that can be epitaxially grown with little or no defects or contamination. It should be noted that other materials having these properties and characteristics could be used for semiconductor material 310 (in lieu of silicon). That said, preferred embodiments will utilize silicon for semiconductor material 310.

It should be appreciated that the fabrication of a finned semiconductor device need not always begin with a bulk substrate. Rather, an embodiment of such a fabrication process may instead begin with the semiconductor device structure 312 depicted in FIG. 5. Thus, a suitably pre-fabricated wafer could be obtained from a vendor, where the pre-fabricated wafer would have bulk semiconductor material, an epitaxially grown etch stop layer on the bulk semiconductor material, and an epitaxially grown layer of semiconductor material on the etch stop layer. Accordingly, fabrication of the fin structures described herein may begin by providing such a pre-fabricated wafer or substrate.

Figure 6:
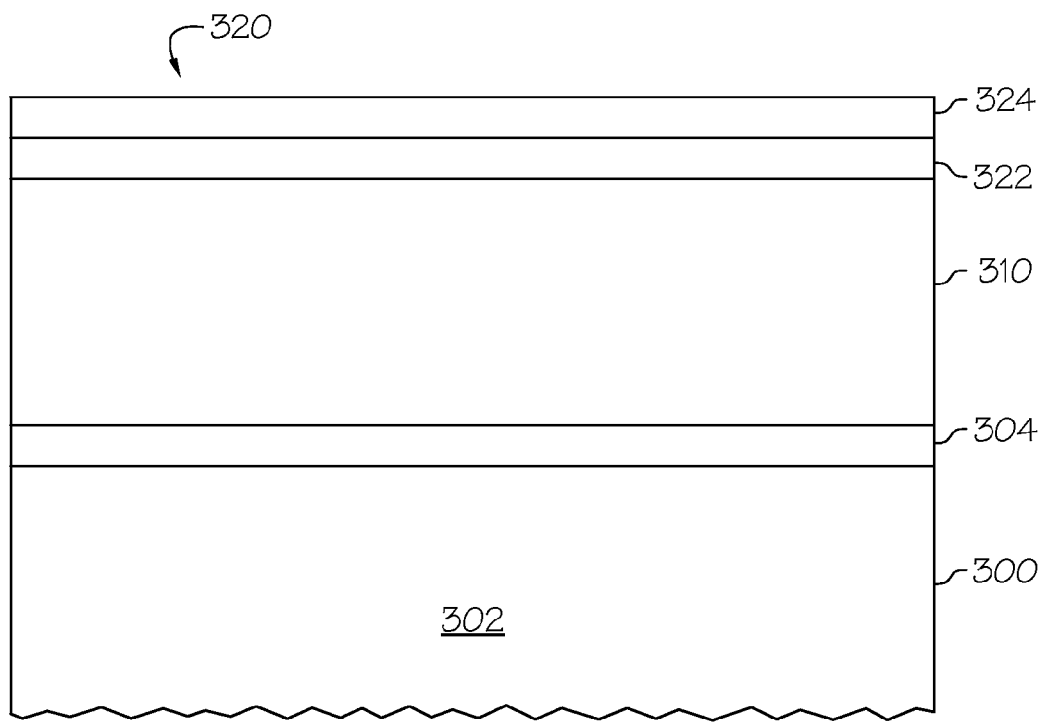

Although other fabrication steps or sub-processes may be performed after semiconductor device structure 312 has been formed or provided, this example continues by forming one or more layers of hard mask (insulating) material overlying semiconductor material 310. FIG. 6 depicts the state of the semiconductor device structure 320 after two layers of insulating material have been formed overlying semiconductor material 310. For this embodiment, semiconductor device structure 320 includes a first layer of insulating material 322 overlying semiconductor material 310, and a second layer of insulating material 324 overlying first layer of insulating material 322. In certain embodiments, first layer of insulating material 322 is formed from an oxide material. This oxide material may be a thermally grown silicon dioxide formed by heating semiconductor device structure 320 in an oxidizing ambient, or it may be a deposited material such as silicon oxide. Alternatively, first layer of insulating material 322 could be silicon nitride, a high-K insulator such as HfSiO, or the like. Deposited insulators can be deposited by chemical vapor deposition (CVD), low pressure chemical vapor deposition (LPCVD), or plasma enhanced chemical vapor deposition (PECVD). In practice, first layer of insulating material 322 is typically 5-30 nm in thickness.

In preferred embodiments, second layer of insulating material 324 is formed by depositing silicon nitride on first layer of insulating material 322, to a thickness within the range of about 5-30 nm. In practice, silicon nitride can be deposited onto first layer of insulating material 322 using, e.g., LPCVD. This nitride material is desirable because it is subsequently used as an etch mask. The nitride material is preferable because it accommodates the selective etching of semiconductor material 310, and because it is a good oxygen barrier. Alternatively, silicon oxy-nitride or amorphous or polycrystalline silicon could be used for second layer of insulating material 324.

Although the embodiment described above includes a lower oxide layer and an upper nitride layer, an alternate embodiment could have a lower nitride layer and an upper oxide layer. Furthermore, more than two layers of insulating material could be employed. Moreover, in alternate embodiments (not shown), the semiconductor material includes an overlying layer of nitride material with no intermediate layer of oxide material. In other words, first layer of insulating material 322 is optional. Moreover, it should be appreciated that a fabrication process may begin with the semiconductor device structure 320 depicted in FIG. 6. Thus, a suitably pre-fabricated wafer having at least the layers depicted in FIG. 6 could be obtained from a vendor, and fabrication of the fin structures may begin by providing such a pre-fabricated wafer or substrate.

Figure 7:
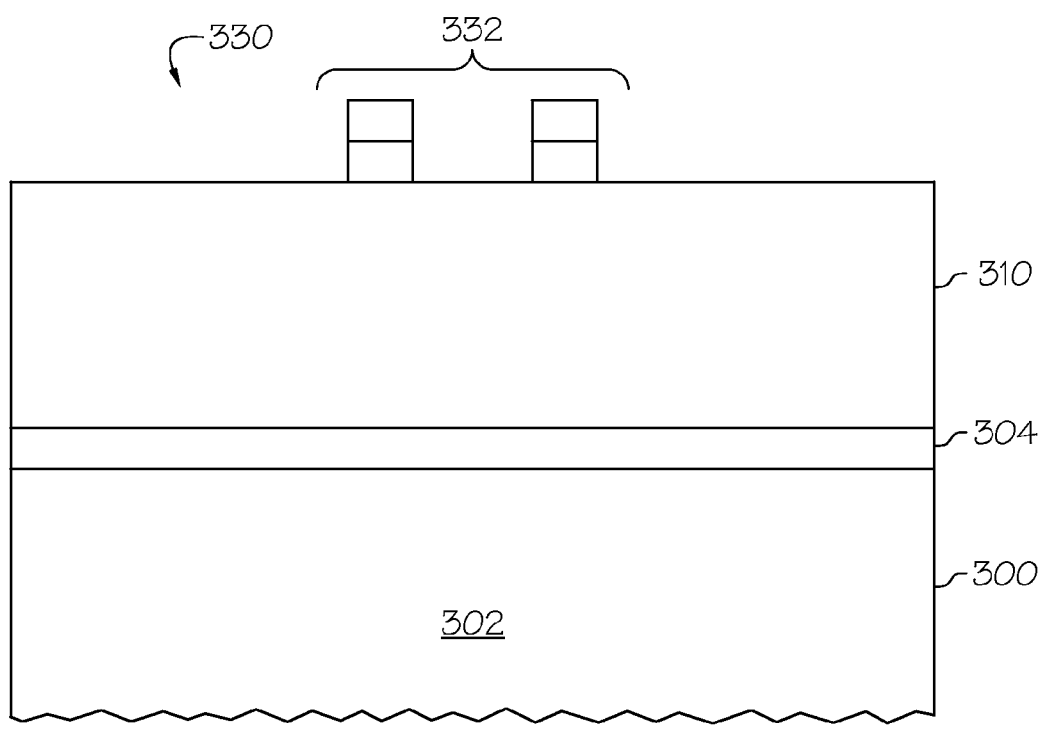

Although other fabrication steps or sub-processes may be performed after semiconductor device structure 320 has been formed or provided, this example continues by selectively removing a portion of first layer of insulating material 322 and a portion of second layer of insulating material 324 to create and define a fin pattern mask. FIG. 7 depicts the state of the semiconductor device structure 330 after formation of a fin pattern mask 332 in this manner. For this embodiment, fin pattern mask 332 is created from the material used for first layer of insulating material 322, and from the material used for the overlying second layer of insulating material 324. Thus, fin pattern mask 332 represents a hard mask that includes masking features defined by the remaining portions of the insulating material.

FIG. 7 depicts semiconductor device structure 330 after the completion of a number of conventional steps. In this regard, fin pattern mask 332 can be formed using process steps such as, without limitation: material deposition or formation; photolithography; spacer imaging; etching; and cleaning. For instance, a soft mask (formed from photoresist material) or a hard mask (formed using spacers) can be formed overlying semiconductor device structure 320 (see FIG. 6) to serve as an etch mask. Thereafter, the unprotected portions of first layer of insulating material 322 and second layer of insulating material 324 can be anisotropically etched using an appropriate etchant chemistry, resulting in semiconductor device structure 330 shown in FIG. 7. Notably, fin pattern mask 332 includes features corresponding to at least one fin. In this example, fin pattern mask 332 has two features that correspond to two respective fins.

Figure 8:
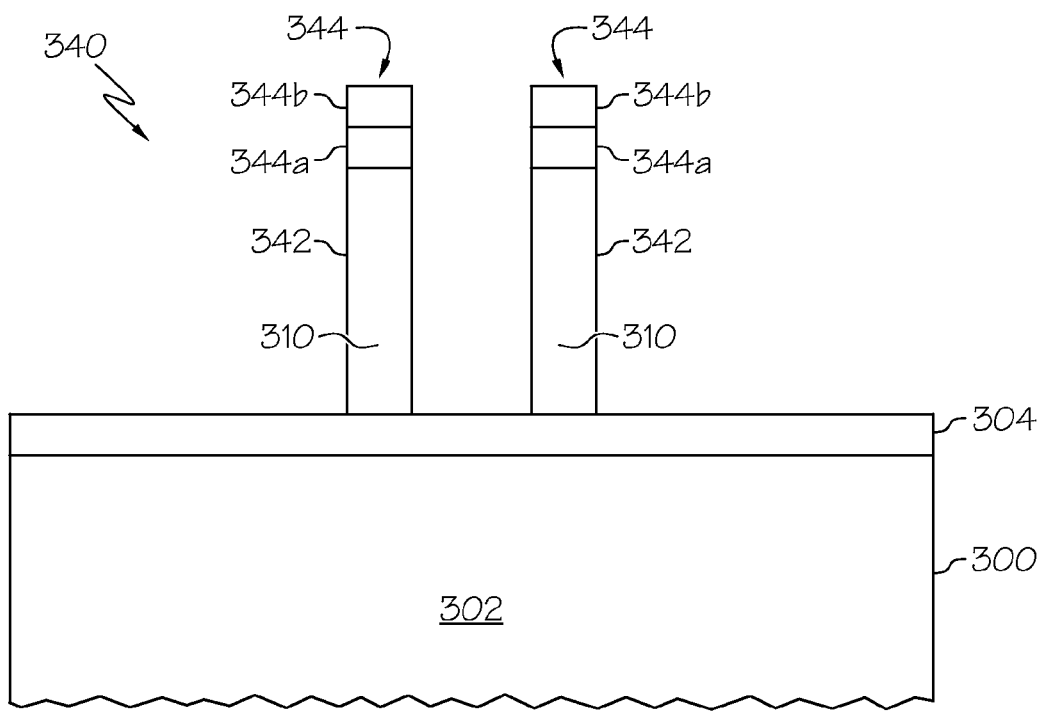

Although other fabrication steps or sub-processes may be performed after the formation of the fin pattern mask 332, this example continues with an anisotropic etching step that selectively etches the layer of semiconductor material 310. FIG. 8 shows the semiconductor device structure 340 after completion of this etching step. Notably, this etching step uses fin pattern mask 332 as an etch mask, which protects the underlying semiconductor material 310. This etching step results in one or more fins 342 being formed from semiconductor material 310, as shown in FIG. 8.

The process preferably employs an anisotropic etchant that selectively etches semiconductor material 310 while leaving etch stop layer 304 intact or substantially intact. As mentioned previously, etch stop layer 304 is formed from a suitable material (such as silicon germanium) that is preferably resistant to the etchant used to form fins 342. In this regard, the silicon germanium serves as an effective etch stop that results in well-defined and closely controlled fin height. Although some wet or plasma etchant chemistries may be suitable for use during the formation of fins 342, preferred embodiments utilize a dry etchant material that selectively etches silicon without attacking silicon germanium. Alternatively, etch stop layer 304 could be formed from an appropriate marker material that can be used to control the etching of semiconductor material 310 (by detecting the marker specie signature in the etch chamber). Thus, the etch stop or marker layer serves as an indicator layer during etching of semiconductor material 310.

The selective etching of semiconductor material 310 forms fins 342, and also results in the creation or exposure of insulating caps 344 that reside on fins 342. The embodiment shown in FIG. 8 has composite insulating caps 344, each being formed from the remaining sections of the first and second layers of insulating material. In particular, each of the insulating caps 344 has a lower oxide portion 344a and an upper nitride portion 344b.

Figure 9:
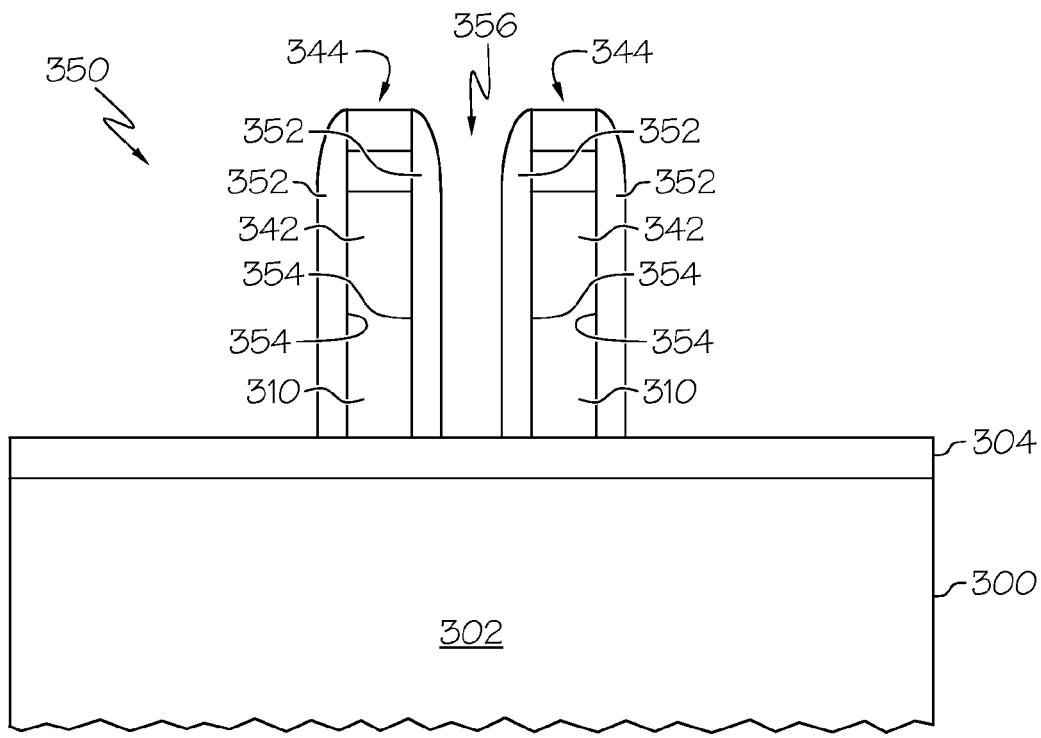

Although other fabrication steps or sub-processes may be performed after the formation of fins 342, this example continues by forming spacers for the fins 342. FIG. 9 illustrates the semiconductor device structure 350 after formation of these spacers 352. As shown in FIG. 9, the spacers 352 are formed adjacent the sidewalls 354 of the fins 342. Spacers 352 can be formed in a conventional manner using well known process techniques that will not be described in detail here. In this regard, spacers 352 may be formed by depositing a layer of spacer-forming material (preferably, silicon nitride) over the exposed surfaces of semiconductor device structure 340 (see in FIG. 8), followed by anisotropic etching of the deposited spacer-forming material using an etchant that selectively removes the spacer-forming material while leaving etch stop layer 304 substantially intact. This results in the formation of spacers 352 that terminate at etch stop layer 304. As shown in FIG. 9, spacers 352 are preferably formed such that a gap 356 remains between any two adjacent and facing spacers 352. Each gap 356 terminates at an exposed surface of etch stop layer 304, where this exposed surface resides between two adjacent spacers 352. The importance of gap 356 will become apparent from the description that follows.

As described in more detail below, the exposed portions of etch stop layer 304 shown in FIG. 9 are sacrificial. Therefore, some or all of these exposed portions could be removed during the etching step that creates spacers 352. In other words, the etching of spacers 352 need not be strictly controlled to stop at etch stop layer 304. In this regard, although the silicon germanium layer actually serves as an etch stop layer while forming fins 342, it need not function as an etch stop layer during subsequent etching steps.

Figure 10:
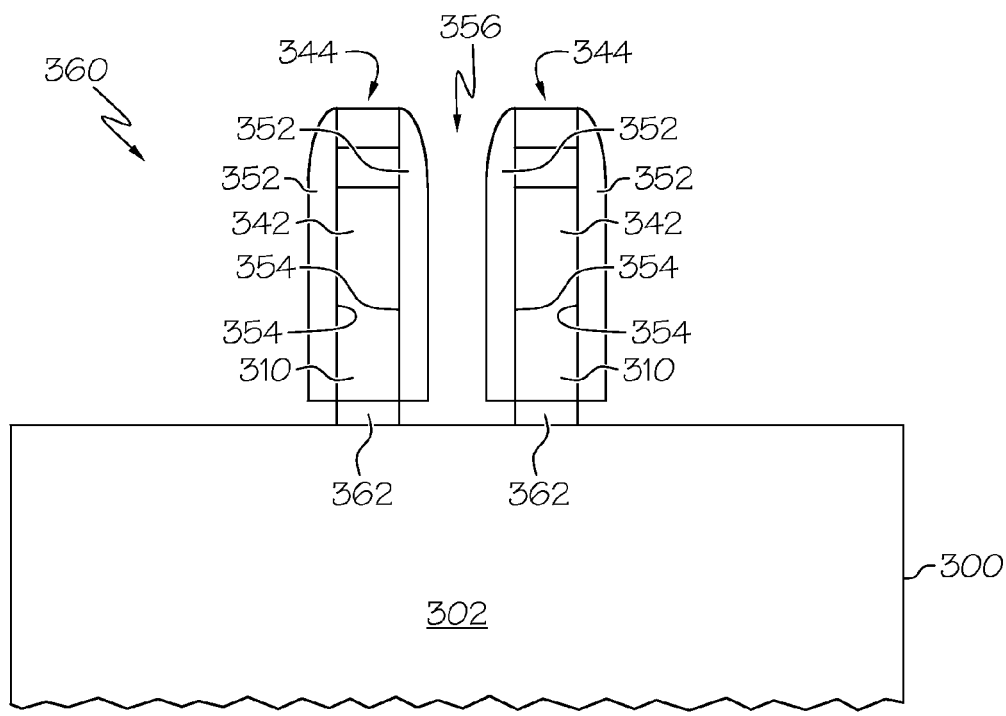

Although other fabrication steps or sub-processes may be performed after the formation of spacers 352, this example continues with an etching step that selectively etches the etch stop layer 304 with respect to the substrate and fin material, using the fin pattern mask (or, equivalently, insulating caps 344) and spacers 352 as an etch mask. FIG. 10 depicts the semiconductor device structure 360 following this etch-back step. Notably, this etch-back step employs an isotropic etchant chemistry that isotropically etches the material used for the etch stop layer 304 (e.g., silicon germanium) in all directions, namely, downward and sideways. The selective nature of this etch-back step is important because it preserves the overall height of the fins. In practice, this etch-back step may utilize a wet etchant, such as a chlorine-based chemistry such as gaseous HCl, or an appropriate dry silicon etchant.

As shown in FIG. 10, the etch-back step results in the formation of neck regions 362, which are formed from the material used for etch stop layer 304. Neck regions 362 are formed by the removal of that portion of the etch stop layer 304 that is unprotected by the etch mask, and by the removal of some of the etch stop layer 304 that is underlying spacers 352. Although not shown in FIG. 10, the etch-back step may also remove some of the etch stop layer 304 that is underlying fins 342. Notably, neck regions 362 correspond to the fins 342. As shown in FIG. 10, each of the neck regions 362 underlies a respective one of the fins 342. Although it is desirable to form relatively narrow neck regions 362, the etch-back step must be carefully controlled to avoid over-etching, which could result in the severing of fins 342 from bulk substrate 300.

Figure 11:
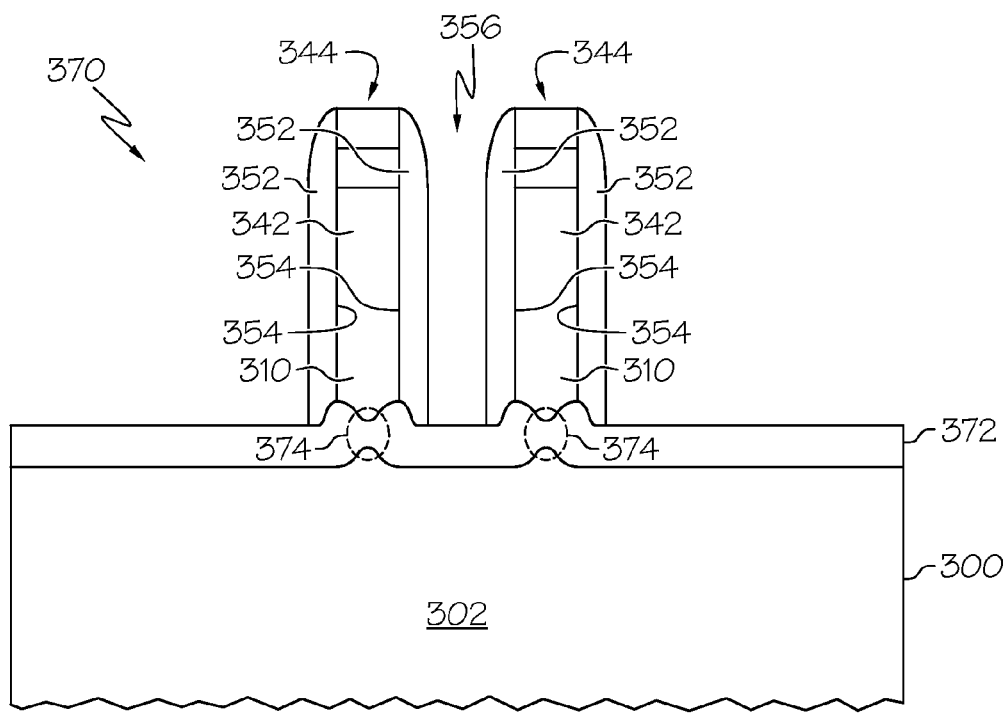

Although other fabrication steps or sub-processes may be performed after the etch-back step, this example continues by isolating the fins 342 from semiconductor material 302 (FIG. 11). Finned semiconductor structures usually employ more than one fin per device. Accordingly, the isolating step also isolates each of the fins 342 from one another. FIG. 11 illustrates the semiconductor device structure 370 after fins 342 have been isolated (i.e., insulated) from semiconductor material 302 and from each other. In this regard, semiconductor device structure 370 includes a suitably arranged isolation layer 372 located between fins 342 and bulk substrate 300. In practice, isolation layer 372 will occupy at least some of the space that was formerly occupied by the material used for etch stop layer 304 (this space is not shown in FIG. 11, but it is depicted in FIG. 10). In the illustrated embodiment, isolation layer 372 completely "fills" this space.

In certain embodiments, isolation layer 372 is formed with a field oxidation process that selectively oxidizes the material that forms neck regions 362. Preferably, neck regions 362 are fully consumed during this field oxidation process, forming connecting regions 374 underlying fins 342. The oxide material is selectively grown from neck regions 362. In other words, the oxide is grown from the material that had been used to form etch stop layer 304 (e.g., the epitaxial silicon germanium). Depending upon how selective the field oxidation process is, there will be more or less oxide material grown from the semiconductor material 310 that forms the fins 342 and more or less oxide material grown from semiconductor material 302. During the field oxidation step, semiconductor device structure 360 (FIG. 10) is exposed to an oxidizing ambient in an elevated temperature that promotes selective growth of oxide at the exposed surfaces of neck regions 362. As illustrated in FIG. 11, some oxide material may actually grow at the base of the fins 342, although such growth is tolerable and, if controlled properly, will not adversely affect the operating characteristics of fins 342. FIG. 11 depicts a case where the field oxidation process continues by forming isolation layer 372 over semiconductor material 302.

It should be noted that during field oxidation, the oxide material grows at a higher rate from the silicon germanium than from silicon. Consequently, in preferred embodiments that use silicon germanium in neck regions 362, the connecting regions 374 are created quickly and well before the remainder of isolation layer 372. The connecting regions 374 can be formed in this manner while minimizing the amount of semiconductor material 310 in the fins 342 that gets oxidized. This, in turn, preserves most if not all of the original fin height. As mentioned above, consistent, predictable, and well-defined fin height is a highly desirable result for finned semiconductor devices.

Figure 12:
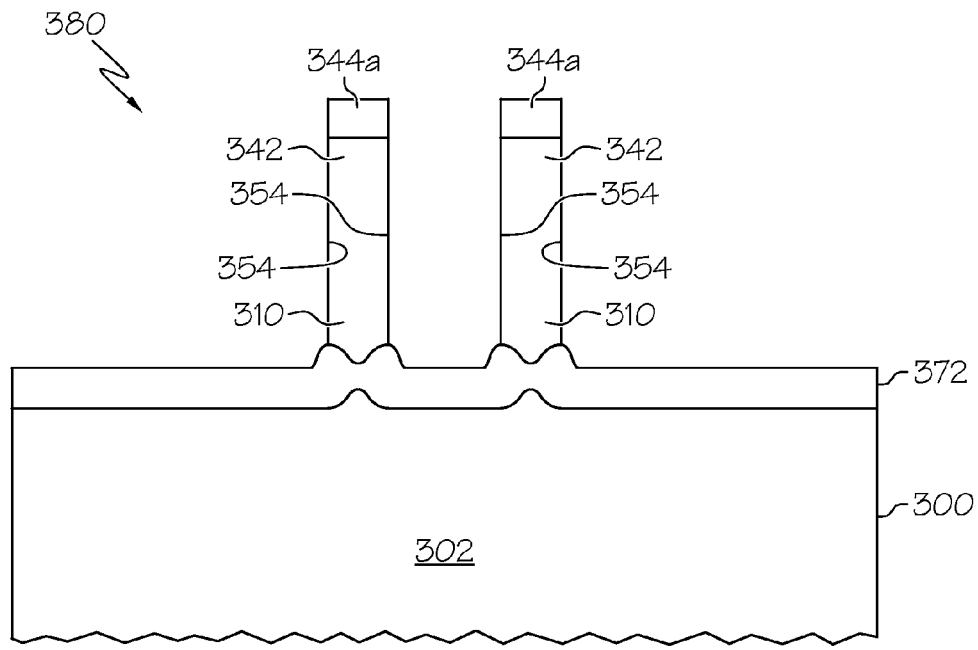

Although other fabrication steps or sub-processes may be performed after the formation of isolation layer 372, this example continues by selectively etching away the upper nitride portions 344b of the insulating caps 344, and by etching away spacers 352 (which, are typically formed from nitride). FIG. 12 depicts the semiconductor device structure 380 after completion of this etching step. In practice, the fabrication process employs a timed endpoint etching technique and an appropriate etchant chemistry that selectively etches silicon nitride material, while leaving the lower oxide portions 344a, the fins 342, and the isolation layer 372 substantially intact. In an alternate process, lower oxide portions 344a are also removed. As shown in FIG. 12, the resulting semiconductor device structure 380 includes fins 342 on bulk substrate 300, where fins 342 are formed from semiconductor material 310. Notably, the sidewalls 354 of fins 342 are exposed at this point in the process.

Figure 1:
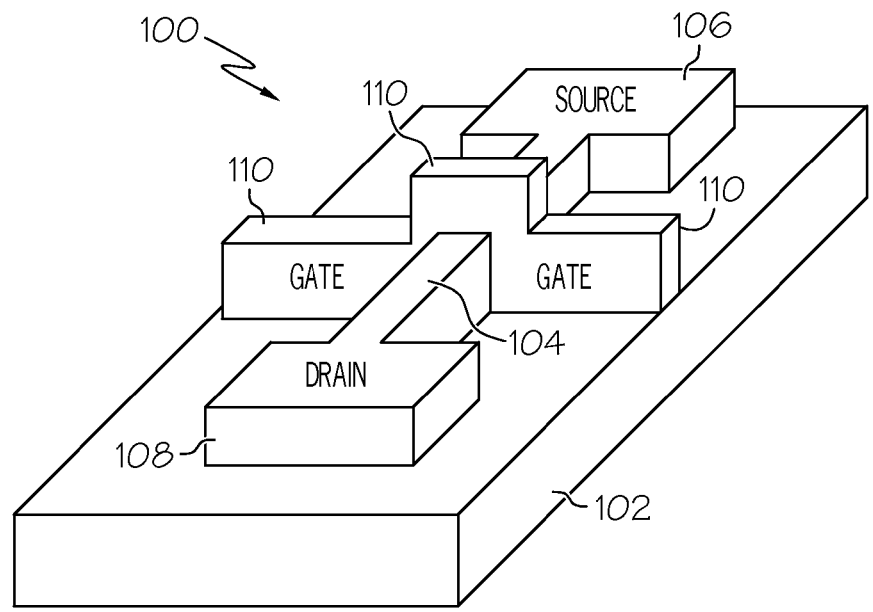
FIG. 1 is a simplified perspective view of a conventional FinFET.
Figure 2:
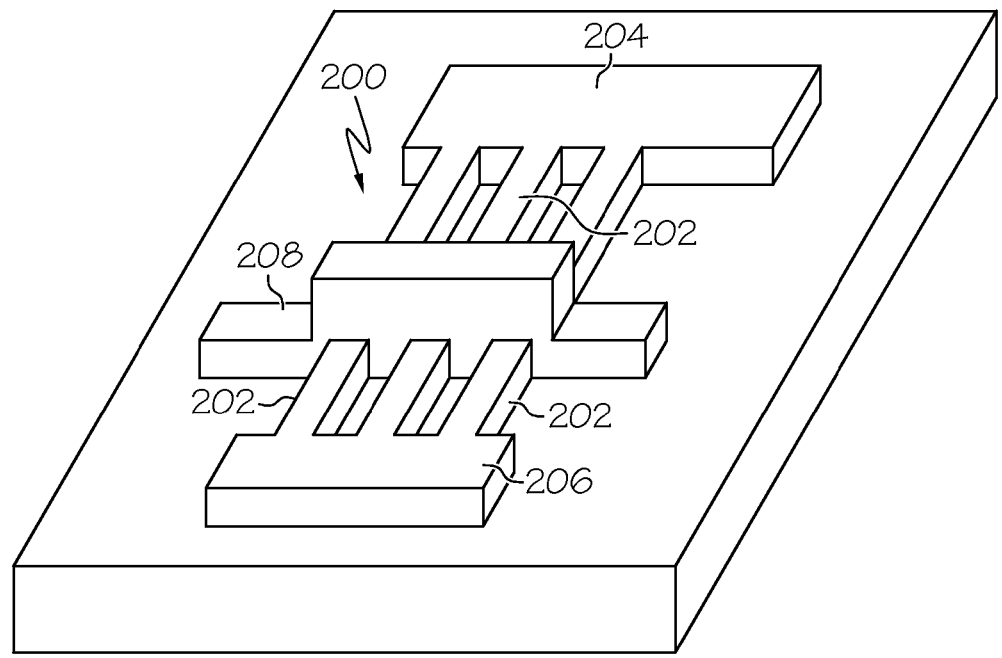
FIG. 2 is a simplified perspective view of a conventional FinFET having a plurality of fins.
Figure 13:
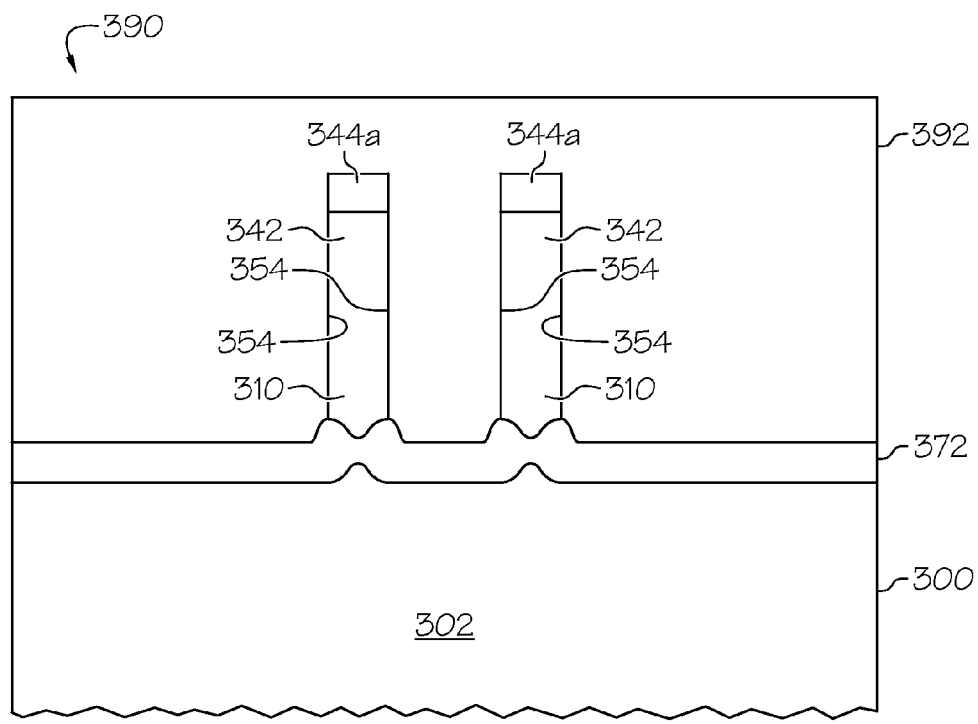

Although other fabrication steps or sub-processes may be performed after the spacers 352 have been removed, this example continues by creating a gate structure overlying the fins 342. FIG. 13 depicts the semiconductor device structure 390 after formation of the gate structure 392, which can be created using a conventional gate stack module or any combination of well-known process steps. It should be appreciated that FIG. 13 is a cross sectional view of semiconductor device structure 390. Accordingly, gate structure 392 will actually be overlying only a section of each fin 342, and gate structure 392 will follow the overall contour of fins 342, contacting respective sections of sidewalls 354 and lower oxide portions 344a. In this regard, gate structure 392 "wraps" over fins 342 in the manner generally depicted in FIG. 1 and FIG. 2.

Thereafter, any number of known process steps can be performed to complete the fabrication of one or more semiconductor devices that incorporate fins 342. For example, the manufacturing process can be carried out to complete the fabrication of at least one transistor device that includes fins 342 and gate structure 392. These final process steps, and other back end process steps, will not be described here.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a fin structure for a semiconductor device, the method comprising:
   providing a bulk substrate formed from a first semiconductor material;
   forming a layer of etch stop/marker material overlying the bulk substrate;
   forming a layer of second semiconductor material overlying the layer of etch stop/marker material, wherein the etch stop/marker material serves as an indicator layer during etching of the second semiconductor material;
   creating a fin pattern mask on the layer of second semiconductor material;
   anisotropically etching the layer of second semiconductor material, using the fin pattern mask as an etch mask, resulting in a fin formed from the second semiconductor material, wherein the layer of etch stop/marker material remains substantially intact following etching;
   forming spacers adjacent sidewalls of the fin; and
   selectively etching the layer of etch stop/marker material, using the fin pattern mask and the spacers as a second etch mask, to form a neck region underlying the fin.

2. The method of claim 1, wherein the first semiconductor material and the second semiconductor material comprise the same material.

3. The method of claim 2, wherein the first semiconductor material and the second semiconductor material are silicon.

4. The method of claim 1, wherein selectively etching the layer of etch stop/marker material comprises isotropically etching the etch stop/marker material to form the neck region.

5. The method of claim 1, further comprising the step of forming an isolation layer between the fin and the first semiconductor material.

6. The method of claim 5, wherein the step of forming the isolation layer comprises growing an oxide material from the etch stop/marker material.

7. The method of claim 6, wherein the step of forming the isolation layer comprises selectively growing the oxide material from the etch stop/marker material.

8. The method of claim 5, further comprising the step of creating a gate structure overlying a section of the fin.

9. The method of claim 1, wherein forming the layer of etch stop/marker material comprises epitaxially growing a layer of third semiconductor material on the first semiconductor material, the third semiconductor material having properties that allow it to be oxidized.

10. The method of claim 9, wherein:
    the first semiconductor material comprises silicon; and
    forming the layer of etch stop/marker material comprises epitaxially growing silicon germanium on the first semiconductor material.

11. The method of claim 1, wherein forming the layer of second semiconductor material comprises epitaxially growing the second semiconductor material on the layer of etch stop/marker material.

12. A method of manufacturing a finned semiconductor device structure, the method comprising:
    providing a substrate comprising bulk semiconductor material, an epitaxially grown layer of etch stop material on the bulk semiconductor material, an epitaxially grown layer of second semiconductor material on the etch stop material, and a layer of hard mask material overlying the second semiconductor material;
    creating a fin pattern mask from the hard mask material, the fin pattern mask having features corresponding to at least one fin; and
    anisotropically etching the layer of second semiconductor material with an etchant, and using the fin pattern mask as an etch mask, resulting in at least one fin formed from the second semiconductor material, wherein the etch stop material is resistant to the etchant;
    forming at least one neck region underlying the at least one fin, by selectively etching portions of the layer of etch stop material; and
    selectively oxidizing the at least one neck region to isolate the at least one fin from the bulk semiconductor material.

13. The method of claim 12, wherein:
    the at least one fin comprises a plurality of fins; and
    the isolating step isolates the plurality of fins from one another.

14. The method of claim 12, wherein the step of selectively oxidizing the at least one neck region forms oxide material between the at least one fin and the bulk semiconductor material.

15. The method of claim 12, wherein:
    the bulk semiconductor material comprises silicon;
    the etch stop material comprises epitaxially grown silicon germanium; and
    the second semiconductor material comprises epitaxially grown silicon.

16. A method of manufacturing semiconductor fins for a semiconductor device, the method comprising:
    providing a bulk semiconductor substrate;

growing a layer of first epitaxial semiconductor material on the bulk semiconductor substrate;

growing a layer of second epitaxial semiconductor material on the layer of first epitaxial semiconductor material;

creating a fin pattern mask on the layer of second epitaxial semiconductor material, the fin pattern mask having features corresponding to a plurality of fins;

anisotropically etching the layer of second epitaxial semiconductor material, using the fin pattern mask as an etch mask, and using the layer of first epitaxial semiconductor material as an etch stop/marker layer, wherein the etching results in a plurality of fins formed from the layer of second epitaxial semiconductor material;

forming spacers adjacent sidewalls of the plurality of fins; and isotropically and selectively etching the layer of first epitaxial semiconductor material, using the spacers as a second etch mask, to form neck regions of the first epitaxial semiconductor material underlying the plurality of fins.

17. The method of claim 16, wherein:

the providing step provides a bulk silicon substrate;

growing the layer of first epitaxial semiconductor material comprises epitaxially growing silicon germanium on the bulk silicon substrate; and growing the layer of second epitaxial semiconductor material comprises epitaxially growing silicon on the silicon germanium.

18. The method of claim 16, further comprising selectively oxidizing the neck regions of the first epitaxial semiconductor material to insulate the plurality of fins from the bulk semiconductor substrate.

19. The method of claim 16, further comprising selectively oxidizing the neck regions of the first epitaxial semiconductor material to insulate the plurality of fins from each other.

* * * * *